June 13, 1967 L. SUDDICK 3,325,586

CIRCUIT ELEMENT TOTALLY ENCAPSULATED IN GLASS

Filed March 5, 1963 2 Sheets-Sheet 1

INVENTOR.
LESLIE SUDDICK

BY

Lippincott, Ralls & Hendricson
ATTORNEYS

June 13, 1967 L. SUDDICK 3,325,586

CIRCUIT ELEMENT TOTALLY ENCAPSULATED IN GLASS

Filed March 5, 1963 2 Sheets-Sheet 2

*INVENTOR.*
LESLIE SUDDICK
BY
Lippincott, Ralls & Hendricson
ATTORNEYS

United States Patent Office 3,325,586

Patented June 13, 1967

3,325,586

CIRCUIT ELEMENT TOTALLY ENCAPSULATED IN GLASS

Leslie Suddick, Santa Clara, Calif., assignor to Fairchild Camera and Instrument Corporation, Syosset, N.Y., a corporation of Delaware Filed Mar. 5, 1963, Ser. No. 262,895

4 Claims. (Cl. 174—52)

Figure 1A:

This invention relates to a method for packaging electric circuit elements, particularly those having exposed electrodes, such as semiconductor devices. The method of the invention provides an integral solid and rigid package containing an electric circuit element. The leads for making external electrical conections to the element extend laterally from the package.

In the past, circuit elements, such as semiconductor devices or capacitors, have been packaged in box-like containers. These boxes have a top, a bottom, and a sidewall joining their perimeters. The circuit element itself is fastened securely inside the package by bonding it to the bottom, for example. The leads from the circuit element extends through the sidewall. The top and bottom of the package are sealed to the sidewall to keep out contamination. A seal is also applied around the leads as they emerge from the side wall to perfect the sealing of the element from the atmosphere.

Sealing the leads as they pass through the sidewall is not an easy operation. Usually a bead of suitable sealing material is applied around each lead where it emerges through an opening in the sidewall, so that this bead forms the seal between lead and opening. Placement of such a bead around each individual lead greatly prolongs the assembly time of the device.

It has not until now been considered feasible to eliminate the sdewall. Always, the sidewall has been believed essential for proper isolation of the sealing material on the top and bottom of the box (which holds it together) from contact with the circuit element. Should the sealing material contact the circuit element, particularly if that element were a semiconductor device, many difficulties might be expected. The differences between expansion coefficients of the circuit element, the package, and the sealing material could cause ruinous strain on the circuit element. If the element were a semiconductor device, the sealing material might easily harm the junctions. Finally, in the event the circuit element had exposed electrodes—the bonds between the leads and these electrodes being very delicate—and the sealing material were allowed to contact the bonds, the sealing operations would certainly be expected to affect these contacts adversely, possibly even breaking them and so causing a reject. The sidewall, therefore, has always been considered essential for proper isolation of the element and electrodes from the sealing material.

Contrary to the previous experience, it has now been discovered that certain thermally sealing materials may be deposited directly in contact with even the most delicate and complex semiconductor devices having oxide coatings, exposed electrodes, and delicately bonded leads. When this deposited layer of sealing material is thermally sealed in accordance with this invention, the resulting structure is a solid, rigid, integral package containing the desired circuit element.

The packages resulting from the method of this invention have only a top and a bottom, with the circuit element surrounded by a layer of sealing material in between. The leads to the element extend laterally at a point between the top and bottom. No longer are any separate steps required to bring the leads through a sidewall—the same seal which binds the top and bottom together and seals the element within the package also secures the leads right up to the point where they extend laterally beyond the perimeter of the package. Such a structure has a much greater strength and rigidity than does a package which is hollow inside. The solid packages of this invention have successfully withstood a force over 200,000 *g*'s without deleterious effect.

Certain other advantages of the solid package of this invention will be apparent. The leads, which in a sidewall package of the prior art were free to move within the confines of the package, no longer have this mobility. The entire length of the leads, from the point where they contact the electrodes of the circuit elements to the point where they emerge from the package, are rigidly held and supported by the sealing material. There is almost no chance of these leads ever coming loose from the circuit element once the package has been sealed. The solid package also has more desirable heat dissipating properties than does the hollow package—heat can be dissipated from the circuit element directly through the solid sealing material. There is no air or empty space to act as an insulator.

Sealing materials are used which may be thermally sealed at temperatures which have no deteriorating effect on temperature-sensitive circuit elements, such as semiconductor devices. The sealing materials used in this invention will not penetrate a good oxide coating on a semiconductor device, nor will they disrupt the bond between electrodes and the conductive leads, as was previously anticipated.

Briefly, the method of making the packages of this invention begins with disposition of a circuit element on either the top or bottom plate of the package. The plates are thin, preformed, substantially flat bodies. If desired, one or both plates may have a coating of the thermally sealable material on one surface. Where one surface of the bottom plate is coated, the circuit element is disposed on that surface. The leads attached to the circuit elements are laid flat over the coated plate so that all of them extend laterally beyond its perimeter. These exposed leads will later be used to make external electrical connections to the circuit element.

The element itself, and the portion of the leads above the bottom plate, are then covered with sealing material. Where this sealing material is powdered glass, for example, it may be deposited as a slurry over the element so that element and leads are completely covered. The top plate is placed over the layer of sealing material; if this plate is also precoated, the precoated side is placed facing down. Finally, the entire package is heated to the temperature at which the sealing material seals the package. If the sealing material itself is a devitrifiable glass, the temperature may also reach the devitrification temperature of the glass. The strength of the package may thereby be increased, with certain types of glass.

Figure 3A:
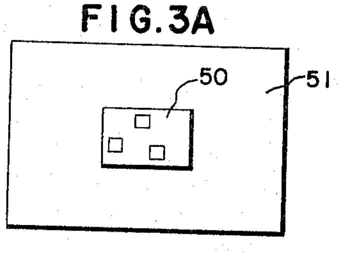
Figure 3B:
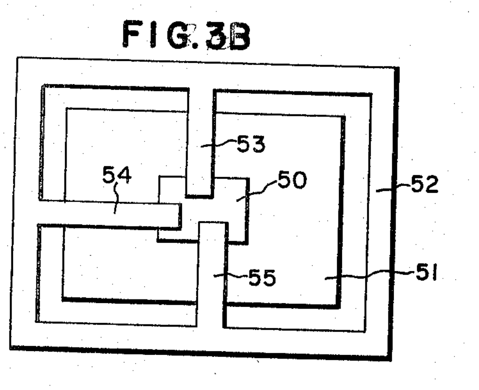
Figure 3C:
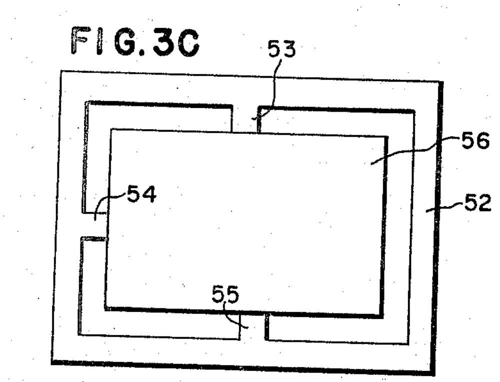
Figure 3D:
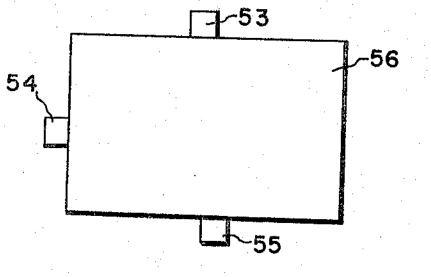
Figure 4A:
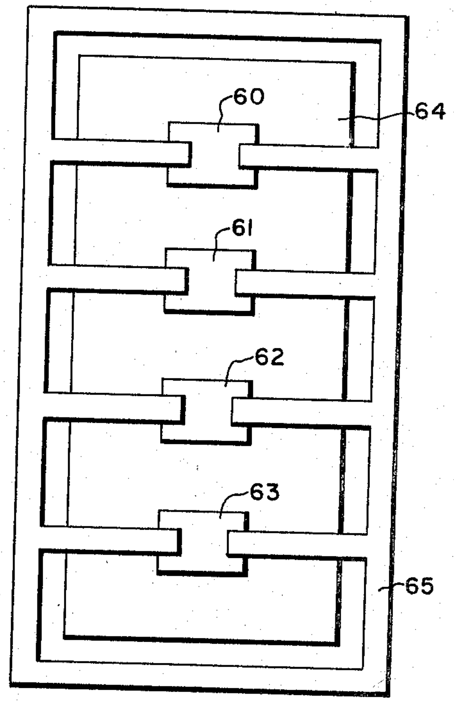
Figure 4B:
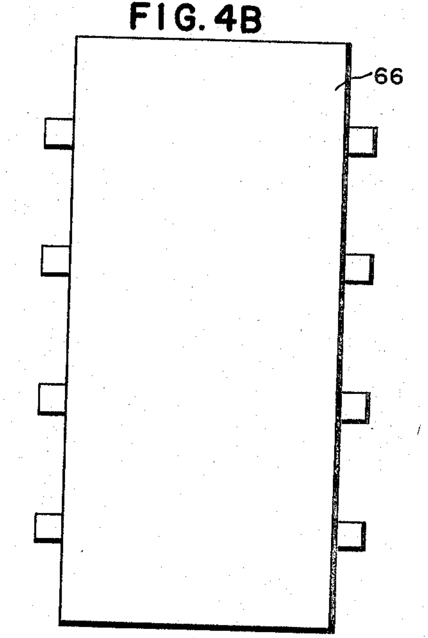

The details of the package and the method of making it will be clarified by the following more detailed description. Reference is made to the drawings, in which:

FIGS. 1A–E are a series of greatly enlarged, somewhat schematic, transverse sectional views showing the method of making the packages of the invention;

FIGS. 2A–D are a series of greatly enlarged, somewhat schematic, plan views showing the method of making a different type of package according to the invention;

FIGS. 3A–D are a series of greatly enlarged, somewhat schematic plan views showing the method of making still other packages according to the invention; and FIGS. 4A–B are two greatly enlarged, somewhat schematic plan views showing the method of packaging more than one circuit element simultaneously according to this invention.

Referring now to FIG. 1A, a thin, substantially flat body or plate 1 is used as the base of the package. The type of material used for plate 1 is not critical to the invention—in some instances, it may be desirable that this plate be electrically conductive, in other instances it may not. Ceramic materials, such as aluminum trioxide, are satisfactory. Plate 1 is normally rigid and very thin, to minimize the overall thickness of the package. It often happens that many of these circuit element packages must be croweded into very small areas; thus, the smaller the packages are, the better. Plate 1 needs only to be thick enough to add structural rigidity to the package. A thickness of about 10 mils, for example, has been found sufficient for this purpose.

Although not essential, it is often desirable to precoat the base plate 1 with a thin layer 2 of sealing material. This layer may be used to prebond the circuit element to the plate 1 to hold it secure prior to the final sealing. The thermally sealable material used for this invention is very carefully chosen. It must be sealable at a temperature which will not harm the circuit element or the bonds between the circuit element and the leads—this is most important. Furthermore, it should form a rigid seal which will not soften at any temperature to which the package might possibly be exposed. A finely divided sealing glass, preferably devitrifiable, such as that described in U.S. Patent No. 2,889,952, may be used. A wide variety of such glasses is available. Glasses which have the required temperature and expansion characteristics are available from the Corning Glass Works under the trade name "Pyroceram." These glasses are mostly a blend of lead or zinc, but may also contain minor amounts of boron, silicon, or other metallic oxides.

Interestingly enough, when the packaged element is a silicon semiconductor device whose expansion coefficient is about $48 \times 10^{-7}$ per °C., a glass sealing material having a similar coefficient would theoretically be required, in order to be compatible with the silicon (as compatibility is defined in U.S. Patent 2,889,952). However, such a sealing material seals at a temperature above that to which the semiconductor device can safely be subjected; if such a high sealing temperature were used, the bonded leads to the device would become unbonded. For this reason, sealing materials sealing at lower temperatures must be used, although these have expansion coefficients about twice as great as those of silicon or of any Kovar leads bonded to the silicon. Such a system has heretofore been thought incompatible.

Surprisingly, however, the table of Pyroceram materials listed in column 3 of U.S. Patent 2,889,952—all having expansion coefficients in the order of $80\text{–}120 \times 10^{-7}$ per ° C.—are compatible with both silicon and Kovar.[1] Of course, when the material used for bonding the leads to the semiconductor material can withstand higher temperatures than can the aluminum conventionally used, then the higher temperature sealing materials with lower coefficients may be employed. Nevertheless, it has been found that in spite of the theoretical incompatibility of the higher-coefficient sealing material, a sturdy, durable device can be obtained.

Figure 1B:
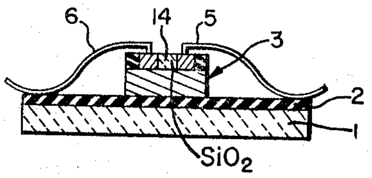

When a precoating 2 is used, it may be applied to plate 1 by glazing. A glass coating is glazed at a temperature below that required for devitrification. The glazed precoating may, if desired, be devitrified later along with the sealing layer. The chief advantage of the precoating is that it permits prebonding of the circuit element to plate 1. As shown in FIG. 1B, the backside of circuit element 3, namely a planar semiconductor device having electrodes on its upper surface, is bonded to plate 1 by heating the glazed coating 2 to its bonding temperature. Prebonding holds the device in place during subsequent assembly steps. Prebonding further assures that after final sealing of the package, the bond between circuit element 3 and plate 1 will remain secure.

[1] Trademark of Westinghouse Electric Corp. for an alloy having 29% by weight nickel, 17% by weight cobalt, and the remainder essentially iron.

Figure 1C:
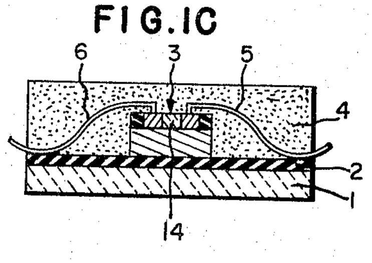

As shown in FIG. 1C, a layer 4 of powdered sealing material is then deposited over the circuit element 3 and over leads 5 and 6. Where glass is used, it is reduced to a powder—preferably one fine enough to pass through a standard 100-mesh screen. The powdered glass may be mixed with a conventional organic binder and carrier liquid to form a suspension or slurry for application to plate 1. The manner of preparation of the glass, and the materials used as binders and carriers may again be found in U.S. Patent 2,889,952. Of course, other materials than these glasses may be used, provided that the two requisites of proper expansion characteristics and proper sealing temperature are met. Layer 4 should cover element 3 completely, and also leads 5 and 6.

In some situations, where a devitrifiable sealing glass is employed, it is preferable to insert a buffer between the devitrifiable sealing glass and the surface of the device to be packaged. In such cases a powdered non-devitrifiable substance may first be used to cover the device and so separate it from the devitrifiable sealing material, which is then applied over the entire structure and devitrified, as described above. The buffer may be an insulator, such as alumina, silica, or some other non-devitrifiable powdered ceramic or glass material. Its purpose is to protect the surface of the circuit device from any mechanical stresses incident to deivtrification; the material chosen for the buffer should therefore be stable at the devitrification temperature to be employed.

Figure 1D:
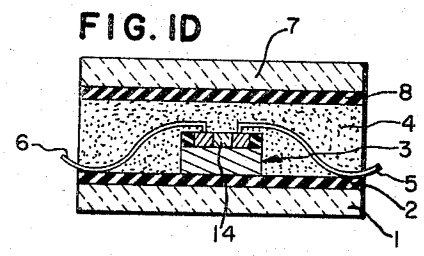

Finally, as shown in FIG. 1D, the cover plate 7 is placed over layer 4. This cover plate may have a preglazed coating 8, as shown, but such a layer is not required; however, a better bond between cover plate 7 and sealing layer 4 may often be obtained if the cover plate is precoated. When the cover plate 7 is identical to base plate 1, mass production methods may be used to preglaze both plates, so that it is not much extra effort to precoat the cover plate as well, and so obtain improved adherence. When base plate 1 is not precoated, however, it is likely that cover plate 7 will not be precoated either.

The entire package is now bonded by heating it to the sealing temperature of the sealing material. This temperature has, as stated above, been carefully chosen so that no harm will come to circuit element 3 by the thermal sealing. Where the sealing material is glass, the heat of sealing is preferably also sufficient to cause devitrification, thus providing a stronger package. In sealing, the layers 2 and 8 of the preglaze integrate with the layer of sealing material 4, resulting in a single integral unified sealing layer 9, as shown in FIG. 1E.

The final package is solid, rigid, and integral. The leads 5 and 6 from element 3 extend laterally beyond the package perimeter; as shown in FIG. 1E, they are completely supported by sealing layer 9, from the points 10 and 11 where they contact the circuit element to the points 12 and 13 where they emerge from the package. Once these leads are finally seated within the package they can no longer move; a device tested and found operative at this time bears extremely little possibility of developing a malfunction later due to failure of a lead bond.

Figure 1E:
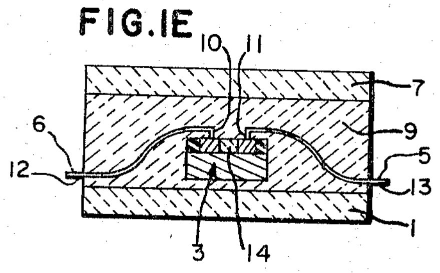

In FIG. 1E, the circuit element shown is a semiconductor device having a surface coating 14 of the oxide of the semiconductor material—here silicon dioxide. This oxide covers the junctions at the surface of the semiconductor device for permanent protection thereof; the electrodes are exposed through the oxide. It is very important that the packaging process not harm this oxide, or else the junctions may be damaged, thereby increasing the reject rate substantially. In the method of this invention, the surface of the device is carefully covered with a slurry of sealing material, and the carrier subsequently evaporated. The oxide coating is unharmed by either the application of sealing material or the final thermal sealing. In fact, the uniform coating of sealing material serves to protect the oxide during the sealing operation.

Another embodiment of the invention is shown in FIG. 2. A circuit element 20 is disposed on base plate 21, as shown in FIG. 2A. In this example, however, there are no preattached conductive leads on the circuit element; instead, a plurality of electrodes 22, 23, 24, 25, and 26 are exposed on one surface of the device, for later attachment of conductive leads. For example, the circuit element may be a semiconductor device having an oxide coating over the surface except where these electrodes are exposed. Electrodes 23–26 are on the top surface; electrode 22 on the bottom.

Figure 2A:
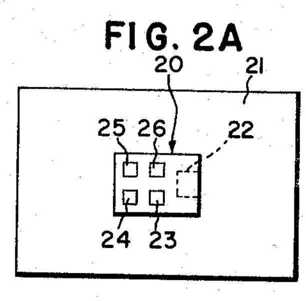
Figure 2B:
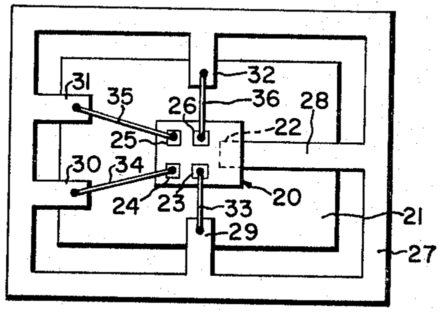

In FIG. 2B, a lead preform 27 is placed over base plate 21. Where base plate 21 is preglazed, the fingers 28, 29, 30, 31, and 32 of the lead preform may be bonded to base plate 21 by heating the sealing material of the preglaze. Similarly (and at the same time, if desired), the circuit element 20 may be bonded to base plate 21. It is observed that finger 28 is disposed beneath element 20 to make contact with electrode 22 on the lower surface.

Next, electrical connections are made to the electrodes of the circuit element. Electrical connection between finger 28 and electrode 22 on the underside of the circuit element 20 may be formed during the bonding of lead preform 27 and circuit element 20 to plate 21. A conductive bonding material is predeposited on the upper surface of finger 28, or on the lower surface of element 20, or both, to form this bond. When bonding is done at the same time as the bonding of preform 27 to base plate 21, the bonding temperature of the conductive material should be approximately the same as the bonding temperature of the sealing material.

Electrical connections or wires 33, 34, 35, and 36 are used to connect fingers 29–32 with electrodes 23–26, respectively. They are bonded to the electrodes and fingers in any conventional manner—thermocompression bonding is often employed. Care should be exercised that the heat of forming these bonds does not cause the bonded preform and circuit element to come loose.

Figure 2C:
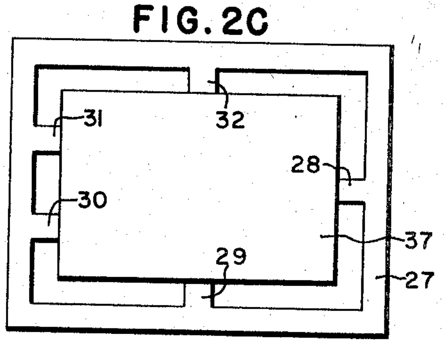
Figure 2D:
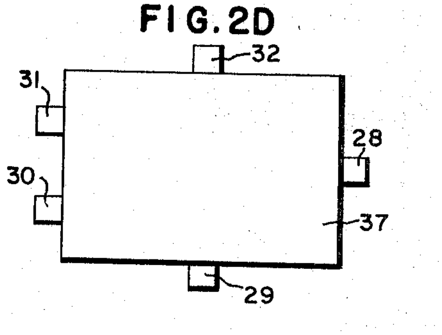

After all electrical connections have been made, the entire device, including element 20, leads 33–36, and those portions of fingers 28–32 which lie over base plate 21 are covered with powdered sealing material in the manner described above. As shown in FIG. 2C, cover plate 37 is placed over the layer of sealing material. The entire package is then heated to the sealing temperature of the sealing material, and a solid integral rigid structure is thereby formed. Leads 33–36, as well as those portions of fingers 28–32 inside the perimeter of the package, are held securely by the rigid sealing layer. The border of lead preform 27 may now be removed, leaving the extending portions of fingers 28–32 exposed as shown in FIG. 2D.

It may be desirable, in some instances, to attach leads to the device inside the package directly through one of the plates. Such connections can, of course, be made by methods well known in the art. Tiny holes are pierced in the cover or base plate, usually ultrasonically, to provide passage for these leads. The leads may then be sealed in the tiny holes by the sealing material. This method of passing leads through the ceramic is well established in the art for use in the attachment of leads through transistor header structures. Consequently, no further explanation is believed necessary here. The leads, protruding inside the plates, are attached to the device inside the package in a manner similar to the lead 28 of the preform 27 of FIG. 2, as explained above.

In the embodiment of the invention shown in FIG. 2, only one finger (finger 28) was bonded directly to the circuit element; the remaining fingers (29–32) were connected to the element by connecting wires 33–36. In the embodiment shown in FIG. 3, all the fingers (in the illustration, three) are bonded directly to the circuit element, obviating the need for extra connecting wires.

Referring now to FIG. 3A, a three-electrode circuit element 50 is disposed on base plate 51. Again, it is discretionary whether or not element 50 is prebonded to the base plate 51. Lead preform 52, shown in FIG. 3B, is placed over base plate 51 and device 50. Fingers 53, 54, and 55 are oriented to register with the three electrodes on the upper surface of the circuit element. None of these electrodes happen to lie on the lower surface; however, it is apparent that by a slight bending of the fingers, certain of them may be used to contact the electrode on the lower surface, and others with electrodes on the upper surface of the element. Contact may be made with vertical surfaces, or with surfaces differently oriented, in the same way. The lead preform 52 may be prebonded to base plate 51, or not, as desired.

Cover plate 56 is then placed over base plate 51, device 50 and lead preform 52, as illustrated in FIG. 3C. The package is heated to effect the final seal between all parts. The frame of the preform is finally removed; this device will now perform in the same manner as the devices of previous embodiments of the invention.

FIG. 4 is included to illustrate inclusion of more than one device in a single package by the method of the invention. Four separated elements 60, 61, 62, and 63 are all disposed on a single base plate 64, as shown in FIG. 4A. Lead preform 65 is used to make contact with the desired electrodes of all circuit elements. The entire structure is covered as before with a sealing layer, and the sealing layer in turn is covered with a cover plate 66, shown in FIG. 4B. The entire package is then heated to form the final integral sealed structure. Electrical connections may be made to the multiple device through the exposed fingers.

Another use of the unique package of the invention is deposition of a printed circuit on the base plate by methods well known in the printed circuit art. Leads may be attached to various portions of the printed circuit by any of the methods discussed above. These leads can extend laterally from the package, or may, if desired, extend through the base or cover plates as mentioned earlier. The final structure is shown in FIG. 4B.

To illustrate the invention further, the following specific example of a semiconductor package is included. However, this example shows only one specific embodiment of the invention, and is not to be construed as placing any limitations on the scope of the invention not recited in the claims.

*Example*

Two ceramic plates were each sprayed on one surface with a fine glass frit and allowed to dry. The ceramic plates were made of a material containing about 94 percent aluminum oxide. The frit was composed of a finely powdered glass containing about 10 percent zinc, 1 percent silicon, 3 percent boron, 72 percent lead, and the remainder various metallic oxides. This material is sold by the Corning Glass Works of Corning, New York, under the trade name "Pyroceram #7572."

A lead preform, such as the one shown in FIG. 2B, was employed. The preform was etched from a Kovar strip (nickel plated, then gold plated over the nickel), which was then prebonded to the glass coating on the bottom plate. A silicon semiconductor device having all its electrodes disposed on the top surface was also bonded to the bottom plate in the center of the preform, as shown in FIG. 2B. One aluminum lead was thermo-compression-welded to each electrode on the surface of the semiconductor. The other end of the lead was similarly thermocompression-welded to the finger of the lead preform to which the respective electrode was to be attached.

Next, the device, the lead preform, and the connecting leads were all covered wtih an ethyl alcohol slurry of the finely powdered glass of the same composition used to coat the bottom plate. As the slurry was daubed over the device and leads, it flowed to form a uniform cover. The alcohol carrier evaporated almost instantly, leaving a smooth upper surface on the sealing layer. A preglazed ceramic top plate, identical to the bottom plate, was placed over the powdered glass sealing layer, glazed side down.

The entire package was sealed by heating to about 390° C. for about 5 seconds. This time is insufficient and the temperature too low to cause devitrification of the sealing material. The conditions are such, however, that the precoatings of glass on the top and bottom plates were unified with the intermediate sealing layer to form an integral bonded package. In some cases, the element may be used as fabricated at this stage of the process.

Preferably, the glass is now devitrified. To do this, the entire package is passed through a belt furnace whose temperature varies from room temperature at entrance and exit, to about 460° C. at the center. The package is held at the maximum 460° C. temperature for about 6 minutes. The remainder of the total time (about 35 minutes) in the furnace is spent in reaching the maximum temperature and in recooling to room temperature. It is well known that the bonds between the aluminum electrodes and the silicon wafer are not harmed by these temperatures. Damage may result to these bonds only above about 577° C., the aluminum-silicon eutectic temperature. If a sealing material is to be used which seals and/or devitrifies above that temperature, the electrodes on the semiconductor material must be formed of some material other than aluminum, and/or a different semiconductor material employed.

As will be apparent to those skilled in the art, many changes may be made in the method of the invention and in the resulting packages, all of which changes are well within the spirit and scope of this invention. Therefore the only limitations to be placed on that scope are those limitations recited in the claims which follow.

What is claimed is:

1. The combination of semiconductor device and package therefor, comprising:

two thin, preformed, substantially flat solid bodies;

a wafer of semiconductor material having semiconductor junctions disposed between said two bodies;

electrical leads in contact with said wafer, said leads extending from between said two bodies for making external electrical connections to said wafer; and a layer of thermally-sealed sealing glass between said bodies, unsupported at its peripheral edges, surrounding said wafer and said electrical leads and in intimate contact therewith, said sealing glass rigidly holding said wafer and leads between said bodies, and rigidly holding said two bodies together to form an integral, solid, rigid package for said wafer.

2. The combination of claim 1 wherein said thermally-sealed glass has been devitrified.

3. The combination of claim 1 further defined by the thickness of said layer being no more than about twice the combined thickness of said two bodies.

4. The combination of a semiconductor device and package therefor, comprising:

two thin, preformed, substantially flat solid bodies;

a wafer of semiconductor material having semiconductor junctions disposed between said two bodies;

electrical leads in contact with said wafer, said leads extending from between said two bodies for making external electrical connections to said circuit element;

a first layer of a non-devitrifiable insulating material covering said wafer and any portion of said electrical leads lying thereover; and a second layer of devitrified, thermally-sealed sealing material covering said first layer and laterally coextensive with said two bodies, unsupported at its periphery, said sealing material rigidly holding said wafer and leads between said bodies, and rigidly holding said two bodies together to form an integral, solid, rigid package for said wafer.

References Cited

UNITED STATES PATENTS

| | | | |
|---|---|---|---|
| 1,244,642 | 10/1917 | Pruessman | 174—52 |
| 1,871,492 | 8/1932 | Brennecke. | |
| 2,398,176 | 4/1946 | Deyrup | 174—50 X |
| 2,683,767 | 7/1954 | Cunningham | 174—52 |
| 2,829,426 | 4/1958 | Franklin | 29—155.5 |
| 3,889,952 | 6/1959 | Claypoole | 220—2.1 |
| 2,994,121 | 8/1961 | Shockley. | |
| 3,001,113 | 9/1961 | Mueller | 317—236 |
| 3,027,502 | 3/1962 | Moriguchi | 317—235 |
| 3,030,562 | 4/1962 | Maiden et al. | 117—200 X |
| 3,063,134 | 11/1962 | McGraw | 29—155.5 |
| 3,072,832 | 1/1963 | Kilby. | |
| 3,098,950 | 7/1963 | Geshner | 174—52 |
| 3,114,866 | 12/1963 | Iwata | 174—52 |
| 3,141,999 | 7/1964 | Schneider. | |

FOREIGN PATENTS

| | | |
|---|---|---|
| 772,231 | 4/1957 | Great Britain. |

DARRELL L. CLAY, *Primary Examiner.*

J. F. BURNS, E. J. SAX, J. P. WILDMAN, *Assistant Examiners.*